(12) United States Patent
Yadav et al.

(10) Patent No.: US 11,322,388 B2
(45) Date of Patent: May 3, 2022

(54) SEMICONDUCTOR STRUCTURE FORMATION

(71) Applicant: Micron Technology, Inc., Boise, ID (US)

(72) Inventors: Vivek Yadav, Boise, ID (US); Shen Hu, Boise, ID (US); Kangle Li, Boise, ID (US); Sanjeev Sapra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 16/549,594

(22) Filed: Aug. 23, 2019

(65) Prior Publication Data

US 2021/0057266 A1 Feb. 25, 2021

(51) Int. Cl.
*H01L 21/762* (2006.01)
*H01L 27/108* (2006.01)
*H01L 21/67* (2006.01)
*H01L 21/02* (2006.01)

(52) U.S. Cl.
CPC .... *H01L 21/76224* (2013.01); *H01L 21/0228* (2013.01); *H01L 21/02123* (2013.01); *H01L 21/67248* (2013.01); *H01L 21/67253* (2013.01); *H01L 27/10876* (2013.01)

(58) Field of Classification Search
None
See application file for complete search history.

(56) References Cited

U.S. PATENT DOCUMENTS

| 7,662,693 | B2 | 2/2010 | Bhattacharyya |
| 7,875,529 | B2 | 1/2011 | Forbes et al. |
| 8,274,777 | B2 | 9/2012 | Kiehlbauch |
| 2021/0057266 | A1* | 2/2021 | Yadav ............... H01L 21/31116 |

* cited by examiner

*Primary Examiner* — Jack S Chen
(74) *Attorney, Agent, or Firm* — Brooks, Cameron & Huebsch, PLLC

(57) ABSTRACT

An example method includes patterning a working surface of a semiconductor wafer. The example method includes performing a first deposition of a dielectric material in high aspect ratio trenches. The example method further includes performing a high pressure, high temperature vapor etch to recess the dielectric material in the trenches and performing a second deposition of the dielectric material to continue filling the trenches.

12 Claims, 10 Drawing Sheets

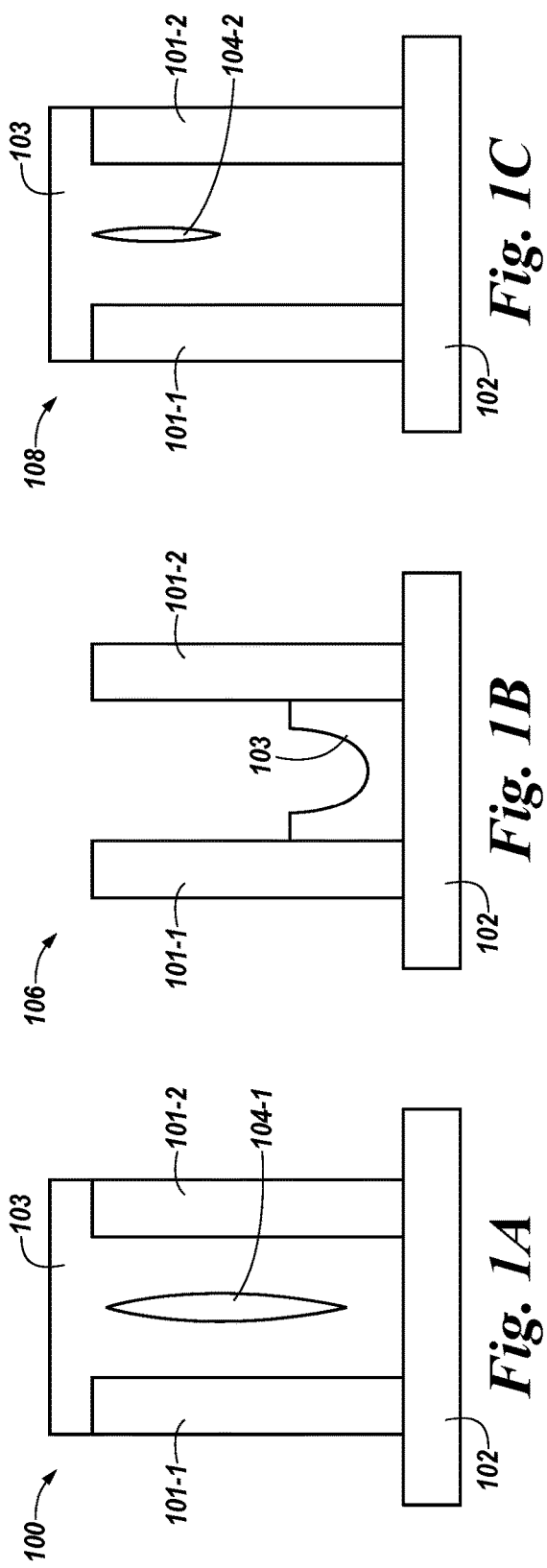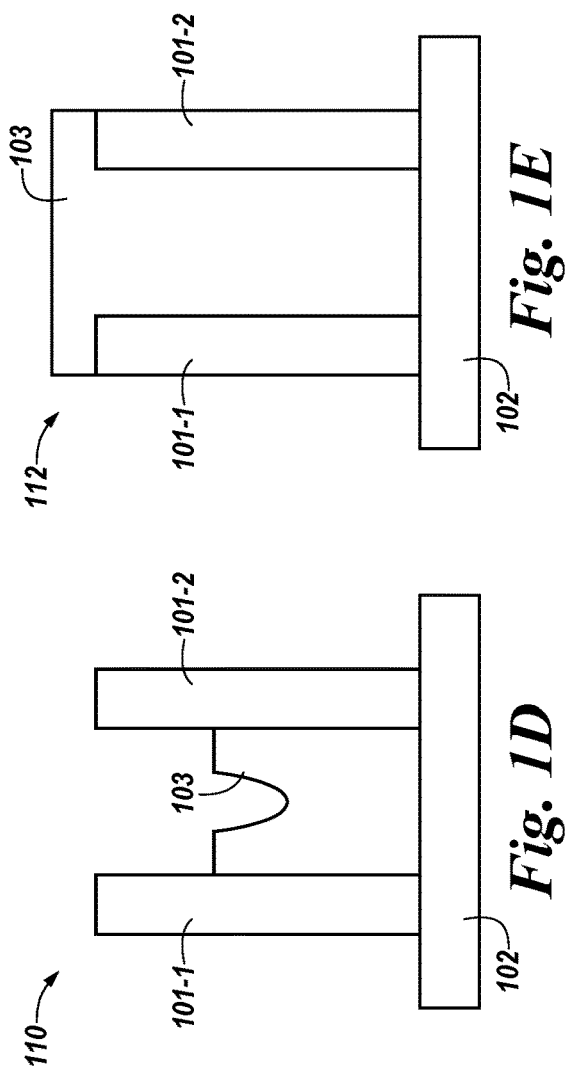

SEMICONDUCTOR STRUCTURE FORMATION

TECHNICAL FIELD

The present disclosure relates generally to semiconductor devices and methods, and more particularly to semiconductor structure formation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 1A-1E illustrate example cross-sectional side views of the deposition of dielectric material on a semiconductor material in accordance with a number of embodiments of the present disclosure.

DETAILED DESCRIPTION

Figure 2A:
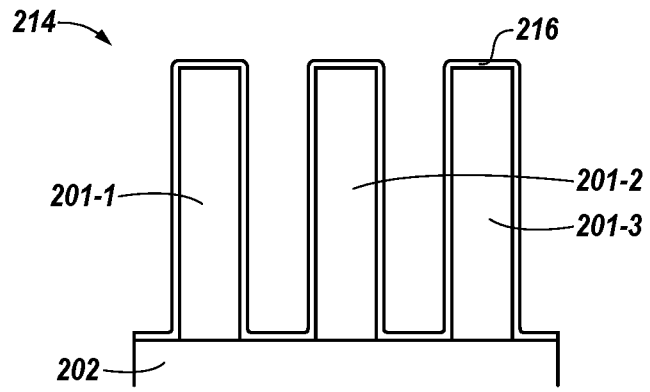
FIGS. 2A-2C illustrate example cross-sectional views of toppling which may occur in semiconductor structure formation.

Various types of memory devices, including arrays of volatile and/or non-volatile memory cells (e.g., a memory array) are disclosed, where semiconductor structures are formed on a substrate and dielectric material fills the trenches between semiconductor structures. For example, according to a particular design rule a semiconductor structure may be formed to a height greater than 200 nanometers (nm). When a dielectric material fills the trenches between the semiconductor structures, a seam may form. As used herein, the term "seam" may refer to a gap in a dielectric material. With shrinking design rules and increased aspect ratios, seams may become more damaging to the memory cells. A process to reduce (e.g., eliminate) seam formation when filling in the trenches between semiconductor structures is beneficial. Seams forming in the dielectric material used to fill the trenches may decrease the performance of the memory device in which the trench is formed. Reducing the formation of seams may help counteract the decreased performance. Example embodiments herein disclose a process for filling in trenches between semiconductor structures without creating a seam.

In some embodiments, the dielectric material used to fill the trenches is an oxide (Ox). In some embodiments, the oxide may be aluminum oxide (AlOx), silicon oxide (SiOx), yttrium oxide (YOx), zirconium oxide (ZrOx), hafnium oxide (HfOx), germanium oxide (GaOx), strontium oxide (SrOx), magnesium oxide (MgOx), among other possible oxides. While examples in the present disclosure discuss filling the trenches with an Ox, embodiments are not so limited and may include other dielectric materials.

Filling the trench without seams may involve filling a trench and then using a high pressure, high temperature vapor etch to remove a portion of the fill. The next deposition is then deposited on the portion of the dielectric material that remains from the previous etch. Since each deposition occurs in the trench which has more material in the trench after each successive etch, the seam starts at a greater height during each deposition.

The high pressure, high temperature etch may also reduce (e.g., prevent) toppling. As used herein, "toppling" refers to semiconductor structures bending and/or falling over. This may reduce toppling due to the high pressure, high temperature etch causing sublimation of the byproducts of the high pressure, high temperature etch rather than redeposition of the byproducts. Reducing the toppling of the semiconductor structures may allow for a dielectric material to be deposited into trenches formed between the semiconductor structures and subsequently etched. Therefore, reducing the toppling of the semiconductor structures may allow for the process of depositing the dielectric material into the trenches without forming a seam.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of pillars lines may refer to at least one pillar.

The figures herein follow a numbering convention in which the first digit or digits correspond to the figure number of the drawing and the remaining digits identify an element or component in the drawing. Similar elements or components between different figures may be identified by the use of similar digits. For example, reference numeral 101 may reference element "01" in FIG. 1, and a similar element may be referenced as 201 in FIG. 2. Multiple analogous elements within one figure may be referenced with a reference numeral followed by a hyphen and another numeral or a letter. For example, 101-1 may reference element 01-1 in FIGS. 1 and 101-2 may reference element 01-2, which may be analogous to element 101-1. Such analogous elements may be generally referenced without the hyphen and extra numeral or letter. For example, elements 101-1 and 101-2 or other analogous elements may be generally referenced as 101.

FIGS. 1A-1E illustrate a cross-sectional view of a method for semiconductor structure formation in accordance with a number of embodiments of the present disclosure. The semiconductor structure formation process illustrated in FIGS. 1A-1E is shown at particular points in time that correspond to particular processing activities being performed in the semiconductor structure formation process. Other processing activities included in a particular semiconductor fabrication sequence may be omitted for ease of illustration.

FIG. 1A illustrates a semiconductor structure formation process at point in time 100. In the illustration of FIG. 1A, pillars 101-1 and 101-2, collectively referred to as pillars 101, may be formed on substrate 102. A dielectric material 103 may be deposited to fill a trench between the pillars 101. In some embodiments, the dielectric material 103 may be an oxide (Ox), a nitride (N), etc. In some embodiments, the N may be a silicon nitride (SiN), a boron nitride (BN), zirconium nitride (ZrN), hafnium nitride (HfN), germanium nitride (GeN), etc.

The dielectric material 103 may be deposited using atomic layer deposition (ALD). During ALD, a material is repeatedly exposed to separate precursors that react with the surface of the material one at a time in a sequential manner. Through these exposures, a thin film is slowly deposited. There are multiple types of ALD. One type of ALD is thermal ALD. Thermal ALD is a deposition technique that uses relatively high temperatures. Thermal ALD may occur between 20 and 900 degrees Celsius (° C.).

When depositing the dielectric material 103 into the trench between pillars 101, a seam 104-1 may form. A seam may be a gap in the material used to fill a trench between semiconductor structures in a memory device. The seam 104-1 may decrease the performance of the memory device in which the seam 104-1 is formed. The decreased performance may result from the seam 104-1 decreasing the effectiveness of the dielectric material 103 in the trench. The dielectric material 103 used to fill the trench may isolate the pillars 101-1 and 101-2. Decreasing the effectiveness of the dielectric material 103 may increase the probability of the pillars 101-1 and 101-2 communicating in an unintended manner.

FIG. 1B illustrates a semiconductor structure formation process at another point in time 106. At point in time 106, a high pressure, high temperature etch may be performed on the dielectric material 103 to reduce toppling. The high pressure, high temperature etch may be a vapor etch. In some embodiments, the pressure of the vapor etch may be 0.2 Torr (T) or higher and the temperature of the vapor etch may be greater than forty (40)° C.

As shown in FIG. 1B, the vapor etch may be used to remove a portion of the dielectric material 103 from the trench between the pillars 101. The reactants used during the vapor etch may include, but are not limited to, hydrogen fluoride (HF), nitrogen trifluoride ($NF_3$), and ammonia ($NH_3$). The vapor etch may recess the dielectric material 103 down to a height that is below the bottom of the seam (e.g., seam 104-1 in FIG. 1A) that was formed during the deposition of the dielectric material 103. Using a vapor etch to recess the dielectric material 103 down to a height below where the seam was formed may remove the seam from the trench. This may also create space within the trench to allow for another deposition of the dielectric material 103.

FIG. 1C illustrates a semiconductor structure formation process at another point in time 108. At the point in time 108, additional dielectric material 103 may be deposited into the trench. ALD may be used to deposit the dielectric material 103 into the trench.

As shown in FIG. 1C, the dielectric material 103 may be deposited to completely fill the trench. A seam 104-2 may be formed during the deposition of the dielectric material 103. The dielectric material 103 may be deposited over the portion of the dielectric material remaining after the etch that occurred the point in time 106. By depositing the dielectric material 103 over the dielectric material remaining after the etch at the point in time 106, the seam 104-2 may be formed at a greater height in the trench than the seam that was formed previously (e.g., seam 104-1 in FIG. 1A).

FIG. 1D illustrates a semiconductor structure formation process at another point in time 110. At the point in time 110, a high pressure, high temperature etch may be performed on the dielectric material 103. The high pressure, high temperature etch may be a vapor etch to reduce toppling. In some embodiments, the pressure of the vapor etch may be 0.2 Torr (T) or higher and the temperature of the vapor etch may be greater than 40° C.

As shown in FIG. 1D, the vapor etch may recess the dielectric material 103 down to a height that is below the bottom of the seam shown in FIG. 1C. By etching the dielectric material 103 down to a height below the seam shown in FIG. 1C, the seam may be removed from the dielectric material 103. The dielectric material 103 may be recessed to a height that is greater than the dielectric material 103 shown in FIG. 1B. It may be recessed to a greater height because the dielectric material 103 may be deposited over the dielectric material remaining after the vapor etch shown in FIG. 1B. Since the dielectric material 103 was deposited on a surface of a greater height within the trench than the surface on which the dielectric material shown in FIG. 1A was deposited, the height of the seam in FIG. 1C may have been formed at a greater height than the seam formed in FIG. 1A. Since the seam in FIG. 1C may have formed at a greater height than the seam in FIG. 1A, a vapor etch that recesses the dielectric material 103 below the bottom of the seam shown in FIG. 1C may recess the dielectric material 103 to a greater height than the dielectric material shown in FIG. 1B.

FIG. 1E illustrates a semiconductor structure formation process at another point in time 112. At the point in time 112, additional dielectric material 103 may be deposited into the trench. ALD may be used to deposit the dielectric material 103 into the trench and completely fill the trench. The dielectric material 103 may be deposited over the portion of the semiconductor material remaining after the vapor etch that occurred at the point in time 110.

As shown in FIG. 1E, the dielectric material 103 may fill the trench without a seam forming. The dielectric material 103 may fill the trench without a seam forming because the dielectric material 103 filled the trench before a seam was able to form in the additional deposition of dielectric material 103.

In some embodiments (not shown in the drawings), a third high pressure, high temperature etch may be used to recess the dielectric material 103. The third vapor etch may recess the dielectric material 103 to a height that is below the bottom of a seam that may have formed during the third deposition of dielectric material 103. Due to the dielectric material 103 being deposited over the dielectric material remaining from the previous etches, the dielectric material may be recessed down to a height that is greater than the height the dielectric material was recessed to after the first and second vapor etches. Sublimation may occur during each of the three vapor etches. A fourth deposition of dielectric material may occur to fill the trench. Every time a cycle of depositing, etching, and then depositing the dielectric material is performed, the seam that may form in the dielectric material may be formed at a greater height in the dielectric material than the seams that may have formed in previous cycles. These cycles may elevate the height of the seams until the dielectric material is deposited without forming a seam.

Figure 2B:
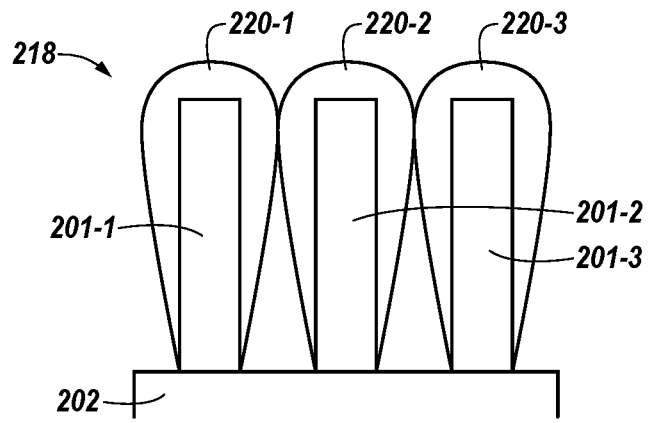
Figure 2C:
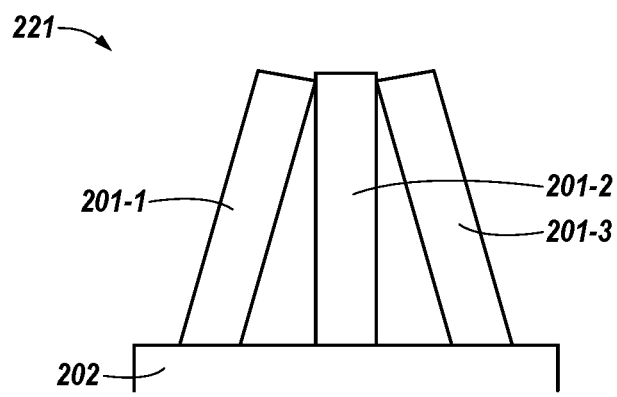

FIGS. 2A-2C illustrate example cross-sectional views of a process resulting in toppling. The process shown in FIGS. 2A-2C illustrates an implementation other than that described in the present disclosure. The pillars may serve as active areas for the semiconductor structure. The process resulting in toppling, illustrated in FIGS. 2A-2C is shown at particular points in time that correspond to particular processing activities being performed in a semiconductor structure formation process. Other processing activities included in a particular semiconductor fabrication sequence may be omitted for ease of illustration.

FIG. 2A illustrates a process resulting in toppling at a point in time 214. At the point in time 214, a substrate 202 has been patterned and pillars 201-1, 201-2, and 201-3, collectively referred to as pillars 201, have been formed on the substrate material. In FIG. 2A, a semiconductor material 216 may be formed on the pillars 201. In some examples, the semiconductor material 216 may be an oxide formed as a result of spontaneous oxidation of the original pillar material (e.g., a native oxide).

FIG. 2B illustrates a process resulting in toppling at another point in time 218. At point in time 218, an etch may have been performed to remove the semiconductor materials (e.g., semiconductor materials 216 in FIG. 2A) from the pillars 201. The etch may be a vapor etch. The pressure during the vapor etch may be less than 150 millitorr (mT). The temperature of the etch may be less than 40° C.

As shown in FIG. 2B, byproducts 220-1, 220-2, and 220-3, collectively referred to as byproducts 220, of the etch may be deposited on the pillars 201. Byproducts 220 may be deposited on the pillars 201 during the etch process. The byproducts 220 of the etch may include, but are not limited to, ammonium fluorosilicate (($NH_4$)$_2$$SiF_6$) and water ($H_2O$). As shown in FIG. 2B, the byproducts 220 may buildup and expand. The ammonium fluorosilicate may be deposited as a solid and the water may be deposited as a liquid or a gas.

FIG. 2C illustrates a process resulting in toppling at another point in time 221. At the point in time 221, the byproducts (e.g., byproducts 220 in FIG. 2B) may have been etched from the pillars 201. The pressure of the etch may be less than 150 mT and the temperature of the etch may be less than 40° C.

As shown in FIG. 2C, etching the byproducts may cause toppling. In some examples, pillars 201-1 and 201-3 may topple over and contact pillar 201-2. This toppling may be caused by the buildup of byproducts. The buildup of the byproducts may destabilize the position of the pillars 201, and it may cause the pillars 201 to topple.

Toppling may cause a variety of issues. In some examples, toppling may cause short circuits. Short circuits may result from unintended contact of electrical components and may cause an unintended diversion of electrical current. The toppling of pillars 201-1 and 201-3 may result in unintended contact between the pillars 201. This contact may cause a short circuit and decrease the performance of the memory device that includes the pillars 201.

Figure 3A:
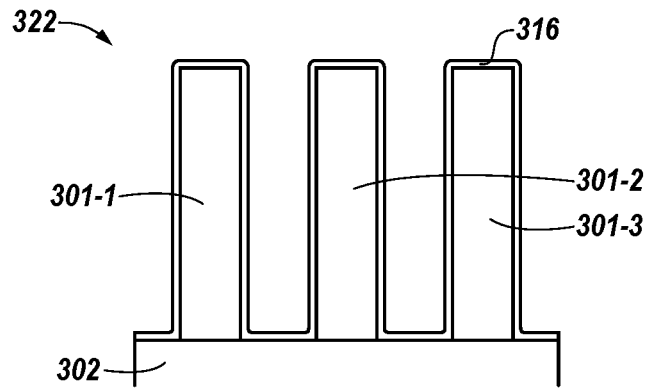
FIGS. 3A-3C illustrate example cross-sectional views of increasing the size of the pillars in a semiconductor structure in accordance with a number of embodiments of the present disclosure.
Figure 3B:
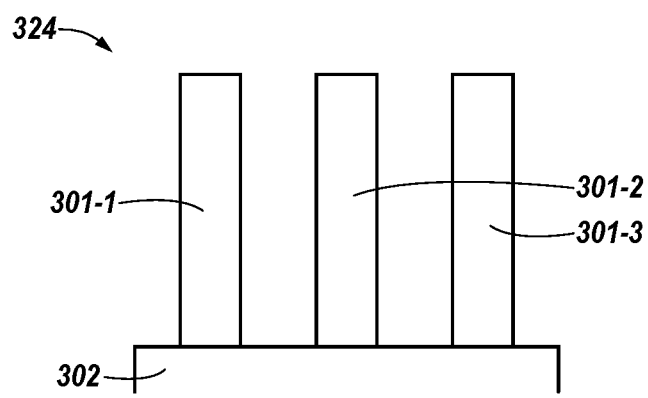
Figure 3C:
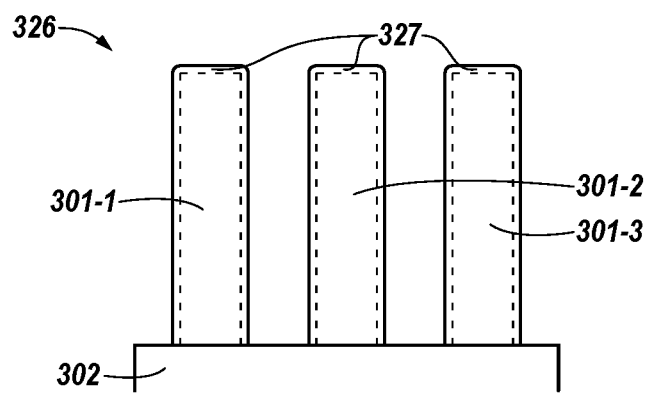

FIGS. 3A-3C illustrate example cross-sectional views of increasing the size of the pillars in a semiconductor structure in accordance with a number of embodiments of the present disclosure. The process shown in FIGS. 3A-3C illustrates a process of increasing the size of pillars 301 by growing semiconductor material on the pillars. The increase of the size of the pillars illustrated in FIGS. 3A-3C is shown at particular points in time that correspond to particular processing activities being performed in the semiconductor structure formation process. Other processing activities included in a particular semiconductor fabrication sequence may be omitted for ease of illustration.

FIG. 3A illustrates increasing the size of the pillars at a point in time 322. At point in time 322, a substrate 302 has been patterned and pillars 301-1, 301-2, and 301-3, collectively referred to as pillars 301, have been formed on the substrate material 302. In FIG. 3A, a semiconductor material 316 may be formed on the pillars 301. In some embodiments, the semiconductor material formed on the pillars 301 may be a native oxide.

FIG. 3B illustrates increasing the size of the pillars 301 at another point in time 324. At a point in time 324, a high pressure, high temperature vapor etch may have removed the semiconductor material (e.g., semiconductor material 316 shown in FIG. 3A). The pressure of the vapor etch may be greater than 0.2 T and the temperature may be greater than 40° C.

As shown in FIG. 3B, the high pressure, high temperature etch may result in the removal of semiconductor material from the active areas. The high pressure, high temperature etch may also leave byproducts (not shown) where the etch occurred. In some examples, the byproducts may consist of ($NH_4$)$_2$$SiF_6$ and $H_2O$. Unlike the process shown in FIGS. 2A-2C, the byproducts may be in a gaseous state. The high pressure and high temperature of the vapor etch may cause the byproducts to sublimate. As used herein, the term "sublimate" may be used to refer to the process of changing a material from a solid to a gas without first becoming a liquid. The sublimation caused by the high pressure, high temperature etch may reduce the buildup of byproducts and, therefore, reduce the toppling seen in FIG. 2C.

FIG. 3C illustrates increasing the size of the pillars 301 at another point in time 326. At the point in time 326, a semiconductor material 327 is grown on the pillars 301. The semiconductor material may be grown on the pillars 301 to increase the size of the pillars 301. In some examples, the semiconductor material 327 grown on the pillars 301 may be silicon (Si).

The high pressure, high temperature etch at the point in time 324 (shown in FIG. 3B) may be a pre-epitaxial growth clean. The pre-epitaxial growth clean may be used to remove semiconductor materials (e.g., semiconductor materials 316 shown in FIG. 3A) from the pillars 301 before epitaxially growing semiconductor material 327 on the pillars 301. The semiconductor material 327 may be grown on the pillars 301 to increase the size of the pillars 301.

Increasing the size of the pillars 301 may provide a semiconductor component more room to connect to the pillars 301. As previously stated, the pillars 301 may serve as active areas for the semiconductor structure. Before increasing the size of the pillars 301, the trenches between the pillars 301 may have a width less than 15 nm. In some examples, the width of the trenches between the pillars 301 may be approximately 13.5 nm. After increasing the size of the pillars 301, the trenches between the pillars 301 may have a width less than 11 nm. In some examples, after increasing the size of the pillars 301, the width of the trenches between pillars 301 may be approximately 10 nm.

Figure 4:
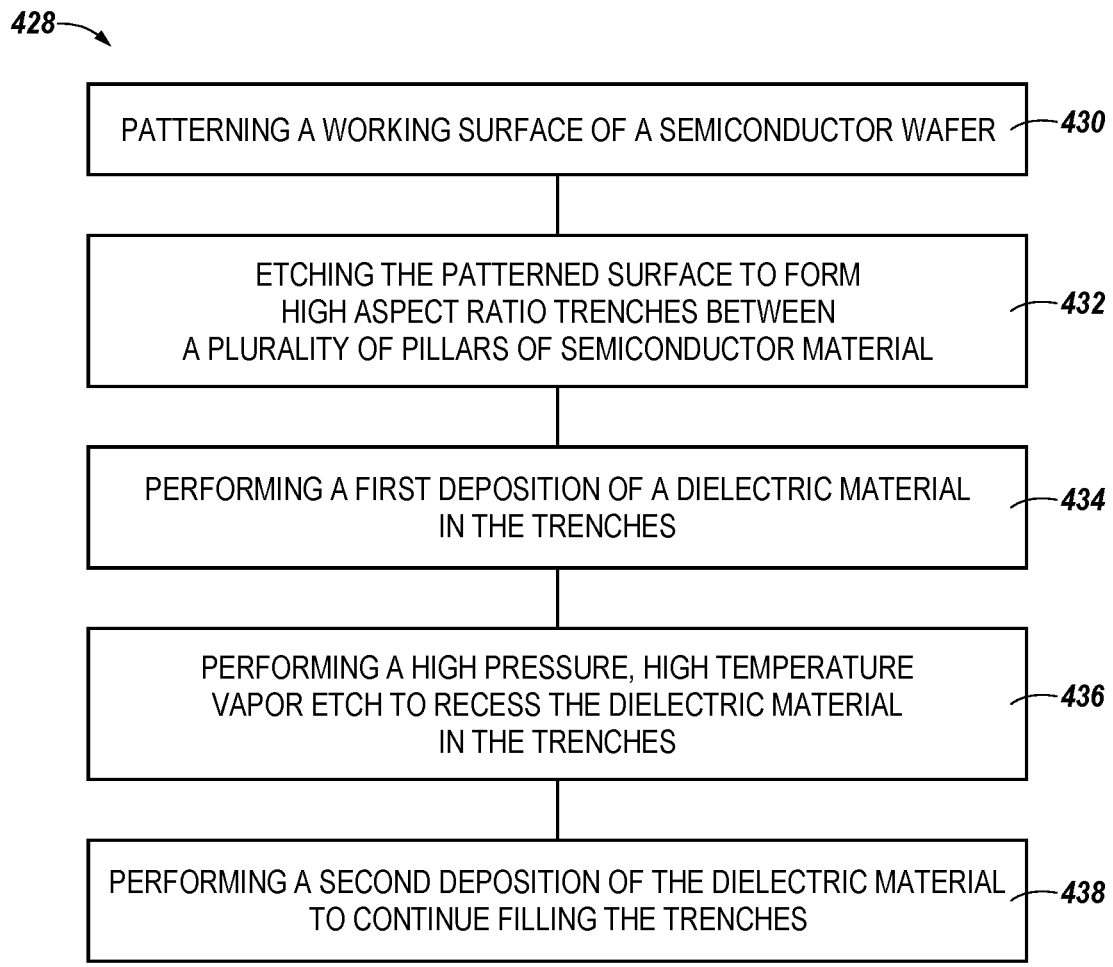
FIG. 4 is a flow diagram of an example method for semiconductor structure formation in accordance with a number of embodiments of the present disclosure.

FIG. 4 is a flow diagram of an example method 428 for semiconductor structure formation in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 430, the method 428 may include patterning a working surface of a semiconductor wafer. At block 432, the method 428 may include etching the patterned surface to form high aspect ratio trenches between a plurality of pillars of semiconductor material. The plurality of pillars may be active areas of a semiconductor device of a memory cell. One example of a semiconductor device may be a buried recessed access device (BRAD). As used herein, the term "high aspect ratio" may refer to an aspect ratio that is greater than 20. The aspect ratio of the trenches may be the ratio of the height of the trenches compared to the width of the trenches. The height of the trenches may be greater than 200 nm and the width of the trenches may be less than 15 nm. In some examples, the height of the trenches may range from approximately 200-1000 nm and the width of the trenches may range from approximately 0-15 nm.

At block 434, the method 428 may include performing a first deposition of a dielectric material in the trenches. In some embodiments, the dielectric material may be Ox. The Ox deposited into the trench may completely fill the trench. The first deposition may cause a seam to be formed in the dielectric material used to fill the trench. The seam formed in the dielectric material may cause a decrease in the performance of the memory device comprising the plurality of trenches.

At block 436, the method 428 may include performing a high pressure, high temperature vapor etch to recess the dielectric material in the trenches. The high pressure, high temperature vapor etch may have a pressure greater than 0.2 T and a temperature greater than 40° C. The vapor etch may recess the dielectric material to a height that is less than the bottom of the seam that may have formed during the first deposition of the dielectric material.

At block 438, the method 428 may include performing a second deposition of the dielectric material to continue filling the trenches. The second deposition may include depositing dielectric material over the dielectric material remaining in the trench after the first vapor etch. The second deposition may completely fill the trench. A seam may form during the second deposition of the dielectric material. The bottom of the seam that may be formed during the second deposition may be formed at a greater height than the seam that may be formed during the first deposition.

A subsequent high pressure, high temperature vapor etch may be performed to recess the dielectric material to a height below the seam that may have formed during the previous deposition. Another deposition may then be formed to completely fill the trench. This deposition may completely fill the trench without a seam forming in the dielectric material used to fill the trench.

Figure 5:
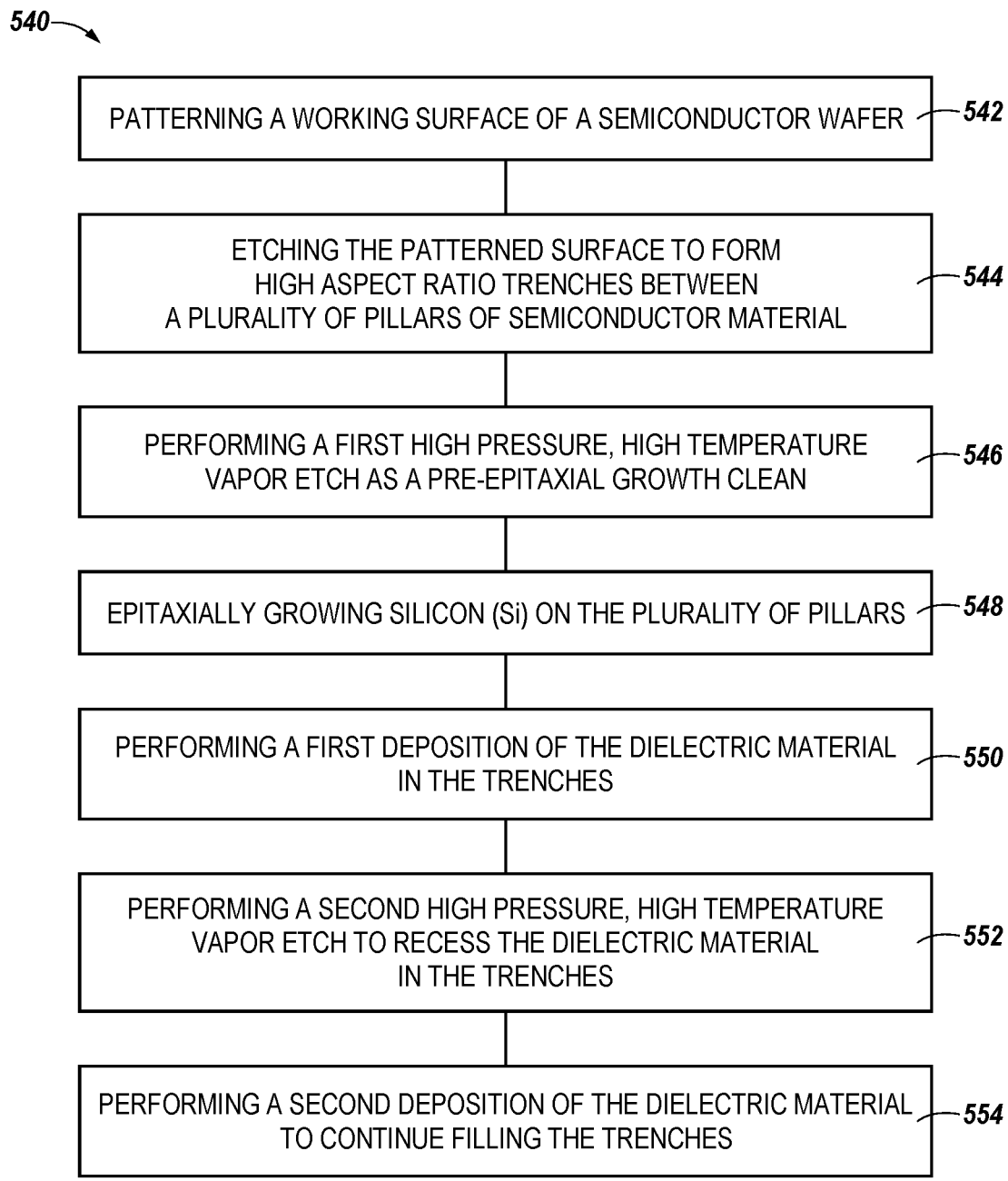
FIG. 5 is a flow diagram of another example method for semiconductor structure formation in accordance with a number of embodiments of the present disclosure.

FIG. 5 is a flow diagram of another example method 540 for semiconductor structure formation in accordance with a number of embodiments of the present disclosure.

At block 542, the method 540 may include patterning a working surface of a semiconductor wafer. At block 544, method 540 may include etching the patterned surface to form high aspect ratio trenches between a plurality of pillars of semiconductor material. The plurality of pillars may be active areas of a semiconductor device of a memory cell. One example of a semiconductor device may be a BRAD. The height of the trenches may be greater than 200 nm and the width of the trenches may be less than 15 nm. In some embodiments, the height of the trenches may be approximately 240 nm and the width of the trenches may be approximately 10 nm. In some embodiments, the aspect ratio of the trenches may be greater than 20.

At block 546, the method 540 may include performing a first high pressure, high temperature vapor etch as a pre-epitaxial growth clean. The first vapor etch may be used to remove materials from the pillars before epitaxially growing a semiconductor material on the pillars. The pressure of the vapor etch may be greater than 0.2 T and the temperature of the vapor etch may be greater than 40° C.

At block 548, the method 540 may include epitaxially growing Si on the plurality of pillars. The Si may be grown on the pillars to increase the size of the pillars. The pillars may serve as active areas of a BRAD. Less than 3 nm of Si may be added to each side of the pillars and the top of the pillars. In some embodiments, Si in a range of approximately 0-3 nm may be epitaxially-grown on each side of the pillars and top of the pillars. In some embodiments, the Si may be epitaxially-grown on the pillars before the first deposition of a dielectric material into the trenches.

At block 550, the method 540 may include performing a first deposition of the dielectric material in the trenches. In some embodiments, the dielectric material may be Ox. The dielectric material may be deposited to completely fill the trenches between the pillars. A seam may form during the deposition of the dielectric material.

At block 552, the method 540 may include performing a second high pressure, high temperature vapor etch to recess the dielectric material in the trenches. The vapor etch may recess the dielectric material in the trenches to a height below the bottom of the seam that may have formed during the first deposition. Recessing the dielectric material to a height below the bottom of the seam may etch the seam out of the dielectric material in the trench.

At block 554, the method 540 may include performing a second deposition of the dielectric material to continue filling the trenches. The second deposition may include depositing the dielectric material over the dielectric material remaining after the second vapor etch. Since the second deposition may be deposited on a surface with greater height than the surface on which the first deposition was deposited, a seam may form at a greater height in the trench than the seam that may have been formed during the first deposition.

A subsequent high pressure, high temperature vapor etch may be performed to recess the dielectric material to a height below the seam that may have formed during the previous deposition. Another deposition may then be formed to completely fill the trench. This deposition may completely fill the trench without a seam forming in the dielectric material used to fill the trench.

Figure 6:
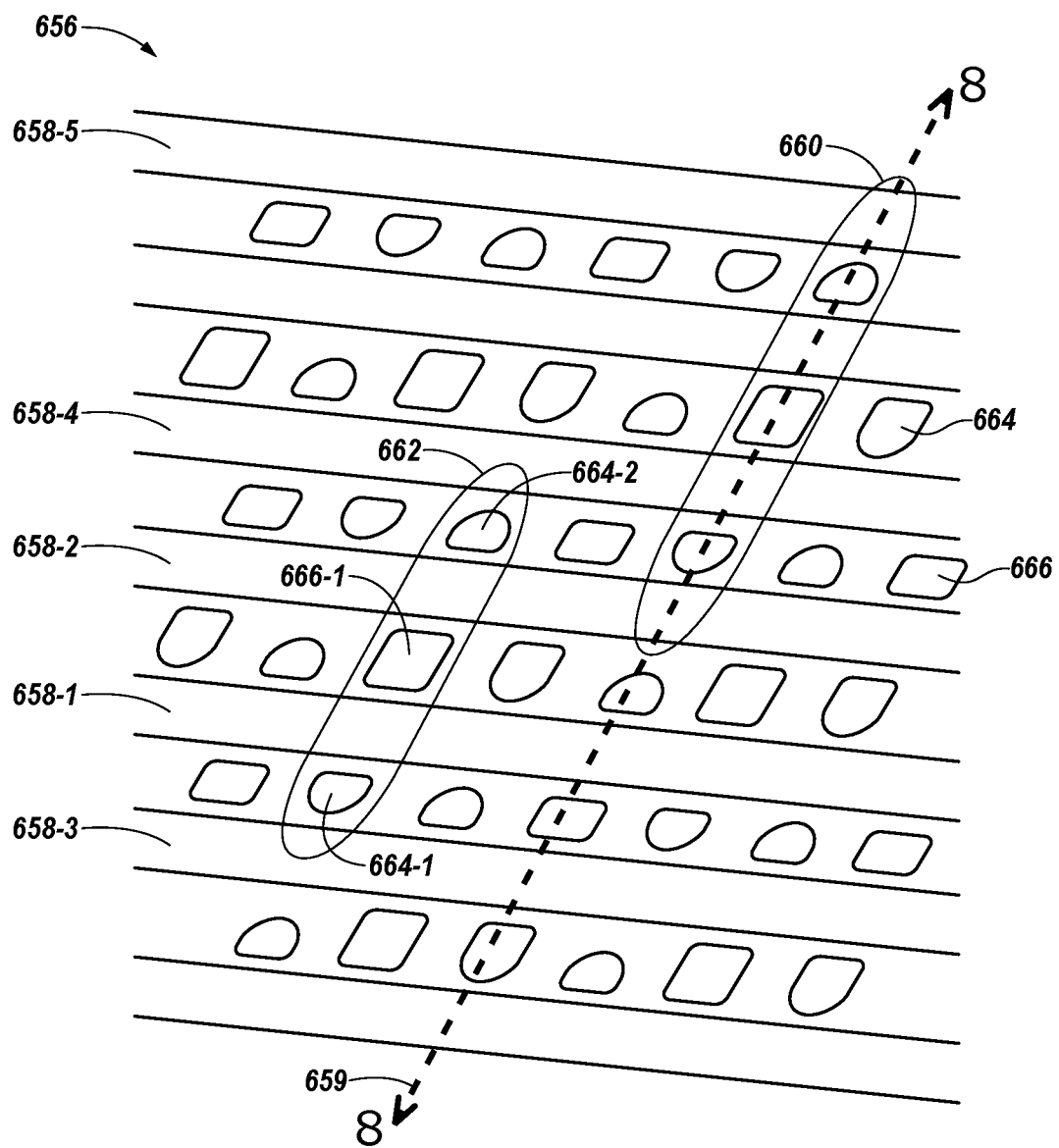
FIG. 6 illustrates an example top-down view of a memory array structure in accordance with a number of embodiments of the present disclosure.

FIG. 6 illustrates an example of a top-down view of a memory array structure 656 in accordance with a number of embodiments of the present disclosure. FIG. 6 illustrates a number of active area regions (e.g., 662 and 660), first source/drain regions 664, 664-1, and 664-2, and second source/drain regions 666 and 666-1. Area 662 encompasses a pair of access devices sharing a second source/drain region 666-1 that may be connected to a sense line and a pair of first source/drain regions 664-1 and 664-2. The second source/drain region 666-1 and the first source/drain regions 664-1 may be separated by a channel and an access line 658-1. Adjacent the example active area 662 on either side may be located a number of passing access lines 658-3 and 658-4 to other active areas.

Figure 8:
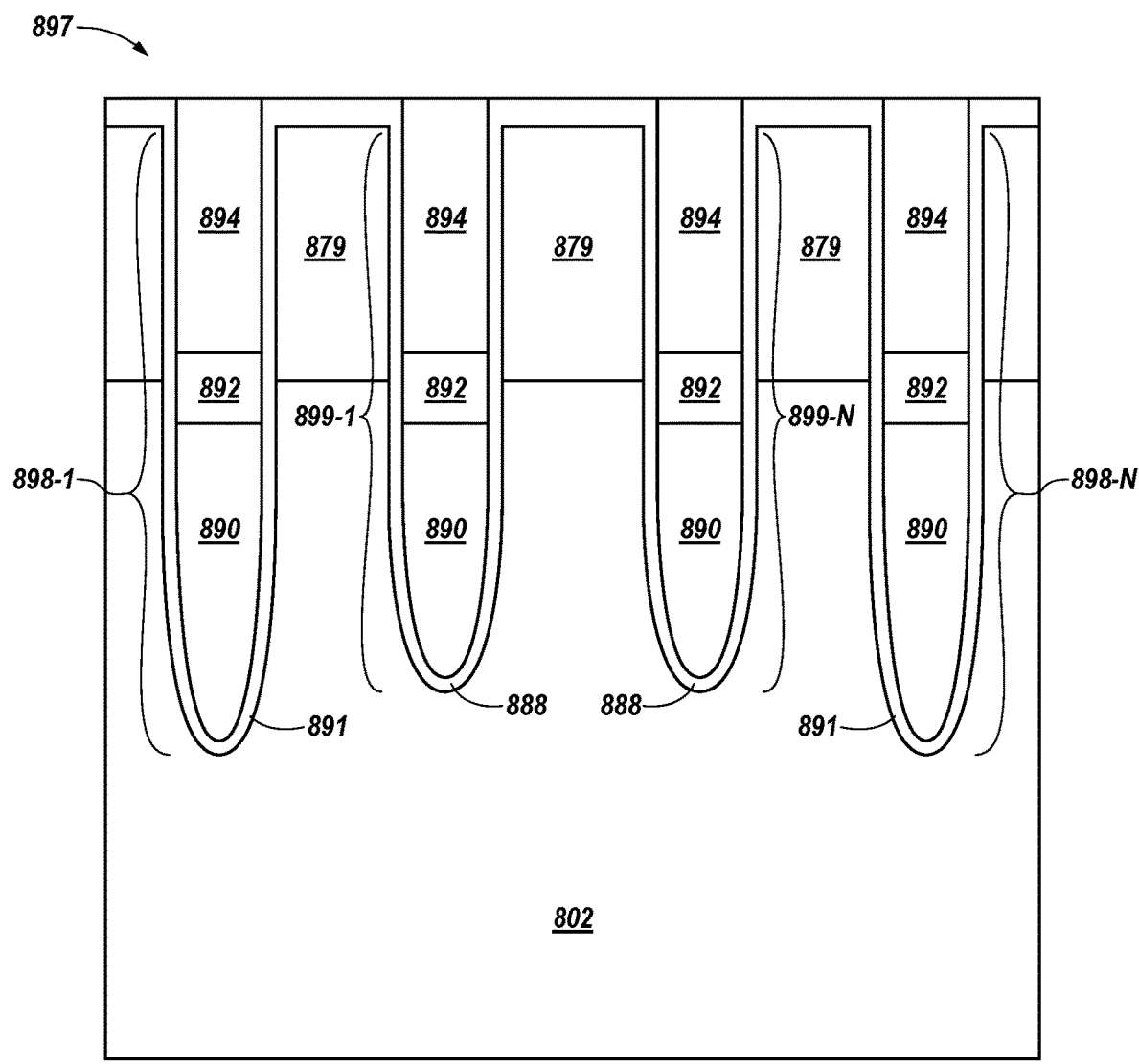
FIG. 8 illustrates an example cross-sectional view of a memory array structure within the substrate of a semiconductor in accordance with a number of embodiments of the present disclosure.

In the example of FIG. 6, area 660 encompasses an active area of neighboring access devices and neighboring, passing access lines 658-2 and 658-5. A cross-sectional view taken along cut line 8 659 is shown in FIG. 8. The passing access lines 658-2 and 658-5 in Area 660, may be formed in isolation trenches (e.g., isolation trench 898 in FIG. 8).

Area 662 illustrates a pair of access devices sharing a source/drain region. Semiconductor structures formed according to the top-down view of an example memory array layout may include access devices (e.g., transistors), and storage nodes (e.g., capacitor cells, etc.). A dynamic random access memory (DRAM) array is one form of example memory arrays that may be formed from semiconductor structures fabricated through a semiconductor fabrication process performed on a substrate of a semiconductor wafer. A memory array may have an of array of access devices and storage nodes forming memory cells at the intersection of rows and columns.

The isolation area may be formed by depositing a dielectric material between adjacent active area regions (e.g., 662 and 660). The dielectric material in the isolation area may decrease the likelihood of semiconductor structures formed adjacent the active area region 662 and 660 communicating (e.g., disturbing one another), in a manner that is not intended.

The access line 658-1 may serve as a gate to adjacent to active areas. An access line (e.g., word line (WL)), may be used to activate an access device (e.g., access transistor), to access (e.g., turn "on" or "off" access), to the storage node (e.g., capacitor cell), of a memory cell. A sense line (e.g., bit line (BL)) may be used to read and/or program (e.g., write, refresh, erase, etc.), to and/or from a storage node of the memory cells.

Figure 7:
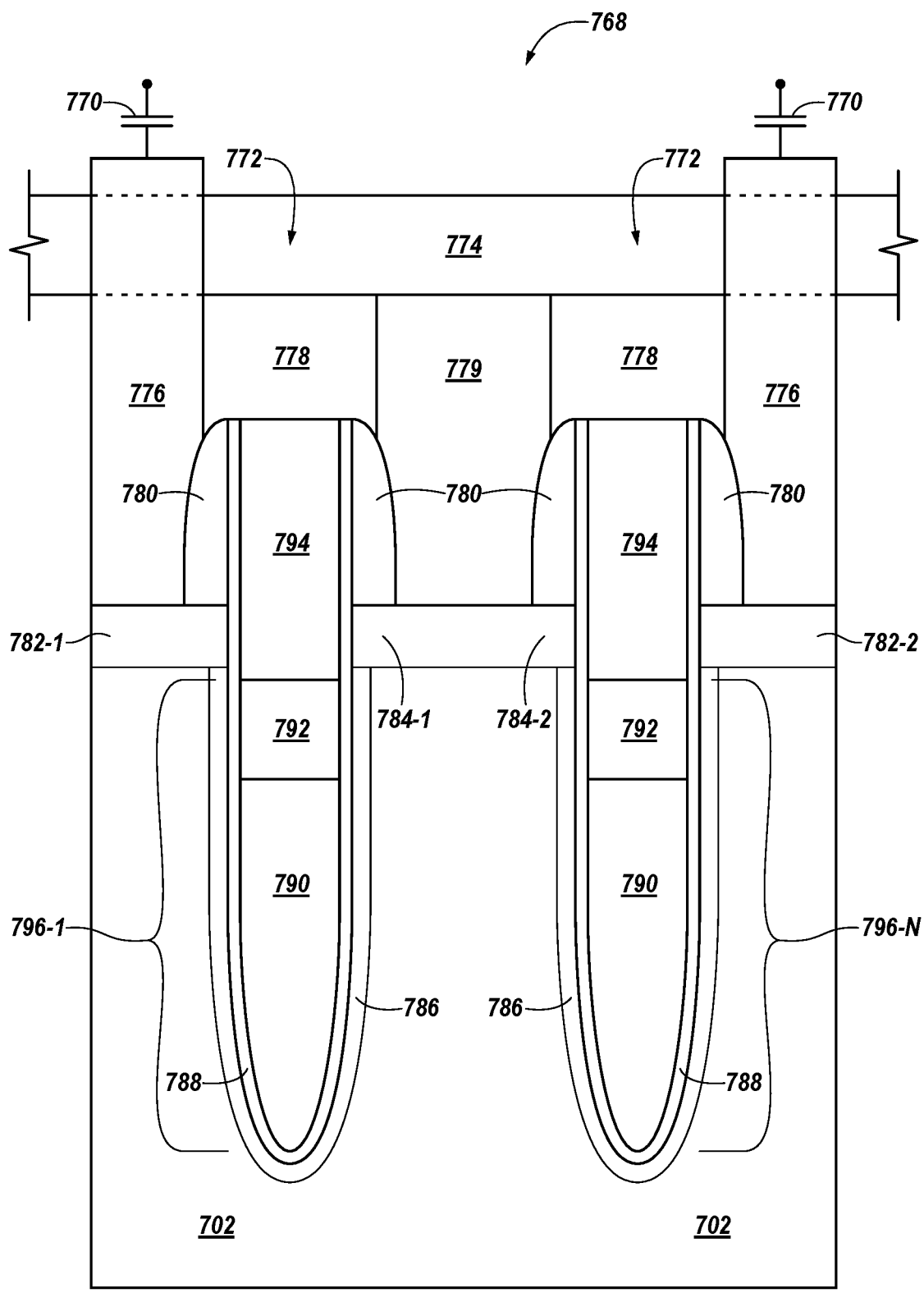
FIG. 7 illustrates an example cross-sectional side view of a memory cell in accordance with a number of embodiments of the present disclosure.

FIG. 7 illustrates a cross-sectional view of an apparatus 768 showing a pair of neighboring memory cells sharing a source/drain region (e.g., 784-1 and 784-2), and a sense line contact 779 connecting to a passing sense line 774. The pair of neighboring memory cells include access devices 772 coupled to storage node contacts 776 and storage nodes 770 in accordance with a number of embodiments of the present disclosure. According to some embodiments, the memory cells include semiconductor structures having epitaxially grown material formed in accordance with the techniques described herein. For example, the storage node contacts 776 may include epitaxially grown material formed in accordance with the techniques described herein.

The access devices 772 include gates 796-1, . . . , 796-N, individually or collectively referred to as gate 796. The gate 796 may also be referred to as a gate electrode. The access devices 772 may include a recessed access device (e.g., a buried recessed access device (BRAD)). In the example shown, the gate 796 may include a first portion 790 including a metal containing material (e.g., titanium nitride (TiN)), and a second portion 792 including a doped polysilicon to form a hybrid metal gate (HMG) 796. The gate 796 may be separated from a channel 786 by a gate dielectric 788. The gate 796 separates a first source/drain region 782-1 and 782-2, collectively referred to as first source/drain region 782, and a second source/drain region 784-1 and 784-2, collectively referred to as second source/drain region 784. In the example of FIG. 7, two neighboring access devices 772 are shown sharing a second source/drain region 784 at a junction. The neighboring access devices 772 may be formed on a working surface of a semiconductor material on a substrate 702.

In the example of FIG. 7, a storage node 770 (shown schematically for ease of illustration) is connected to a storage node contact 776 formed in accordance with the techniques described herein. The storage node contact 776 may be connected to an active area (e.g., a first source/drain region 782) of an access device 772. An insulation material 778 (e.g., a dielectric material) may be formed on the spacer material 780 and the gate mask material 794, and in contact with a conductive material 779 serving as a sense line contact 779. The sense line contact 779 may be connected to a sense line 774 (e.g., passing sense line) orthogonal to a directional orientation of access lines connecting to gates 796 of the access devices 772. In the example illustration of FIG. 7, the illustrated passing sense line 774 is actually recessed into the page, parallel to the plane of the drawing sheet so as to be offset a particular depth from the storage nodes 770. Access lines connected to gates 796 may be running perpendicular to a plane of the drawing sheet (e.g., coming out of the page).

In some embodiments the sense line contact 779 may be a metallic material (e.g., Tungsten (W)). The insulation material 778 may be formed on the spacer material 780 and the gate mask material 794, and in contact with the conductive sense line material 779.

FIG. 8 illustrates a cross-sectional view of the memory array structure 897 taken along cut-line 8 (as shown in FIG. 6) and encompassed by active area region 660 (as shown in FIG. 6). FIG. 8 illustrates isolation trenches 898-1, . . . , 898-N, collectively or individually referred to as isolation trench 898, and gates 892 and 890, collectively or individually referred to as gate 890, formed to a depth of 899-1, . . . , 899-N into a working surface of a substrate material 802. FIG. 8 also illustrates a gate dielectric 888 deposited in the gate 890. Isolation trench 898 may include a dielectric material 891, passing access line conductive materials 890 and 892, an insulator fill 894. Dielectric material 879 may be deposited between isolation trenches 898 and gates 890.

The isolation trenches 898 may include a dielectric material 891, passing access line conductive materials 890 and 892, and an insulator fill 894. The isolation trenches 898 may isolate the gates 890 from adjacent gates. This may prevent unintended communication between gates 890 and adjacent gates. Unintended communication between gates 890 and adjacent gates may decrease the performance of the memory array.

Figure 9:
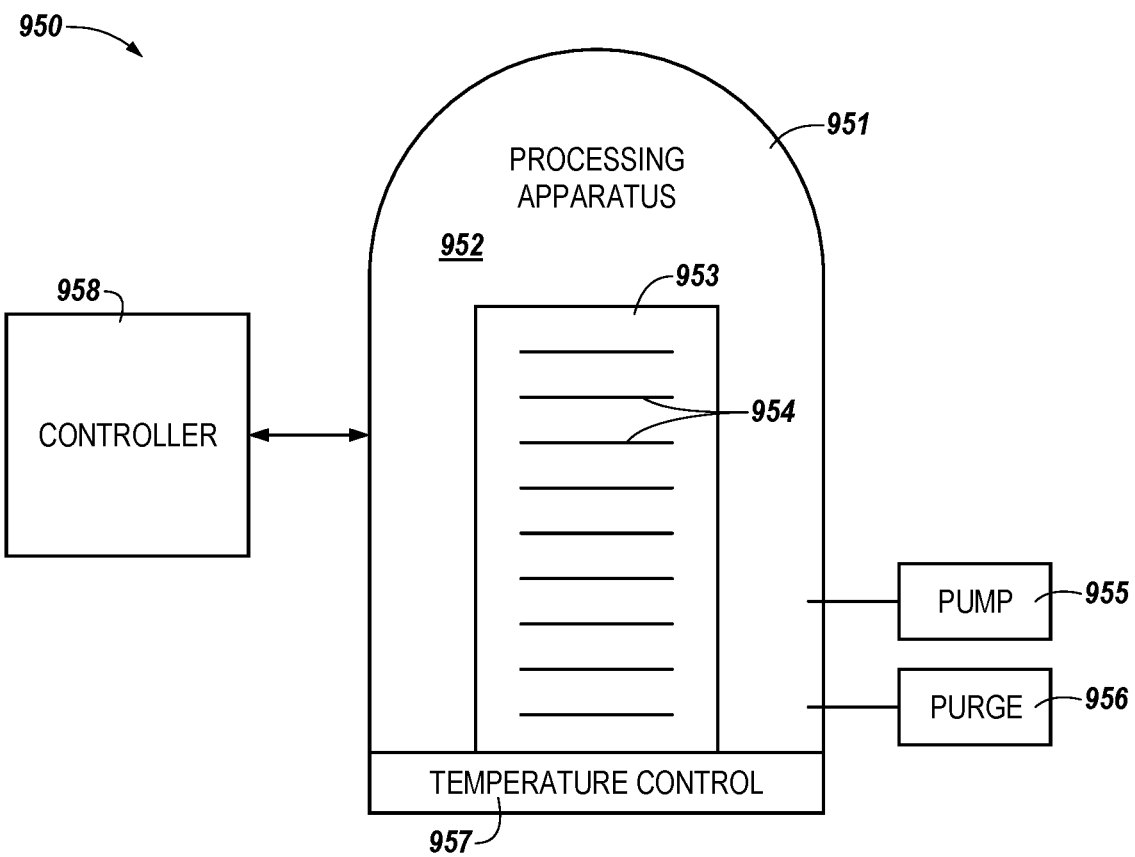
FIG. 9 is a functional block diagram of a system for implementation of an example semiconductor fabrication process in accordance with a number of embodiments of the present disclosure.

FIG. 9 is a functional block diagram of a system 950 for implementation of an example semiconductor fabrication process in accordance with a number of embodiments of the present disclosure. The numbering convention used in connection with FIG. 9 does not follow the earlier introduced numbering convention and sequence that applies to FIGS. 1-8. The system 950 may include a processing apparatus 951. The processing apparatus 951 may be configured to enable formation of structural materials on and/or removal of structural materials from a semiconductor device during fabrication of the semiconductor device.

FIG. 9 illustrates an example processing apparatus 951 that may be used in a semiconductor fabrication process. The processing apparatus 951 may include a chamber 952 to enclose components configured to perform deposition and/or etch operations on a number of semiconductor devices. The chamber 952 may further enclose a carrier 953 to hold a batch of semiconductor wafers 954. The processing apparatus 951 may include and/or be associated with tools including, for example, a pump 955 unit and a purge 956 unit configured to introduce and remove appropriate etch chemistries, as described herein, at each point in the semiconductor fabrication sequence. The processing apparatus 951 may further include a temperature control 957 unit configured to maintain the chamber 952 at an appropriate temperature at each of the points in the fabrication sequence. The system 950 may include a number of chambers 952 that are each configured to perform particular processes (e.g., a wet etch process, a dry etch process, and/or a deposition process, among others) during the fabrication sequence.

The system 950 may further include a controller 958. The controller 958 may include, or be associated with, circuitry and/or programming for implementation of, for instance, semiconductor structure formation. Adjustment of such deposition, removal, and etching operations by the controller 958 may control the critical dimensions (CDs) of the semiconductor devices created in the processing apparatus 951.

A host may be configured to generate instructions related to semiconductor structure formation. The instructions may be sent via a host interface to the controller 958 of the processing apparatus 951. The instructions may be based at least in part on scaled preferences (e.g., in numerically and/or structurally defined gradients) stored by the host, provided via input from another storage system (not shown), and/or provided via input from a user (e.g., a human operator), among other possibilities. The controller 958 may be configured to enable input of the instructions and scaled preferences to define the CDs of the fabrication of the semiconductor device to be implemented by the processing apparatus 951.

The scaled preferences may determine final structures (e.g., the CDs) of passing sense lines, storage node contact, and epitaxially grown material. Particular CDs may be enabled by the particular scaled preferences that are input via the instructions. Receipt and implementation of the scaled preferences by the controller 958 may result in corresponding adjustment, by the processing apparatus 951, of the characteristics of the semiconductor structure that is formed, among implementation of other possible scaled preferences.

The controller 958 may, in a number of embodiments, be configured to use hardware as control circuitry. Such control circuitry may, for example, be an application specific integrated circuit (ASIC) with logic to control fabrication steps, via associated deposition and etch processes, for semiconductor structure formation. The controller 958 may be configured to receive the instructions and direct performance of operations to perform the semiconductor structure formation methods as described in connection with FIGS. 3A-3C.

Figure 10:
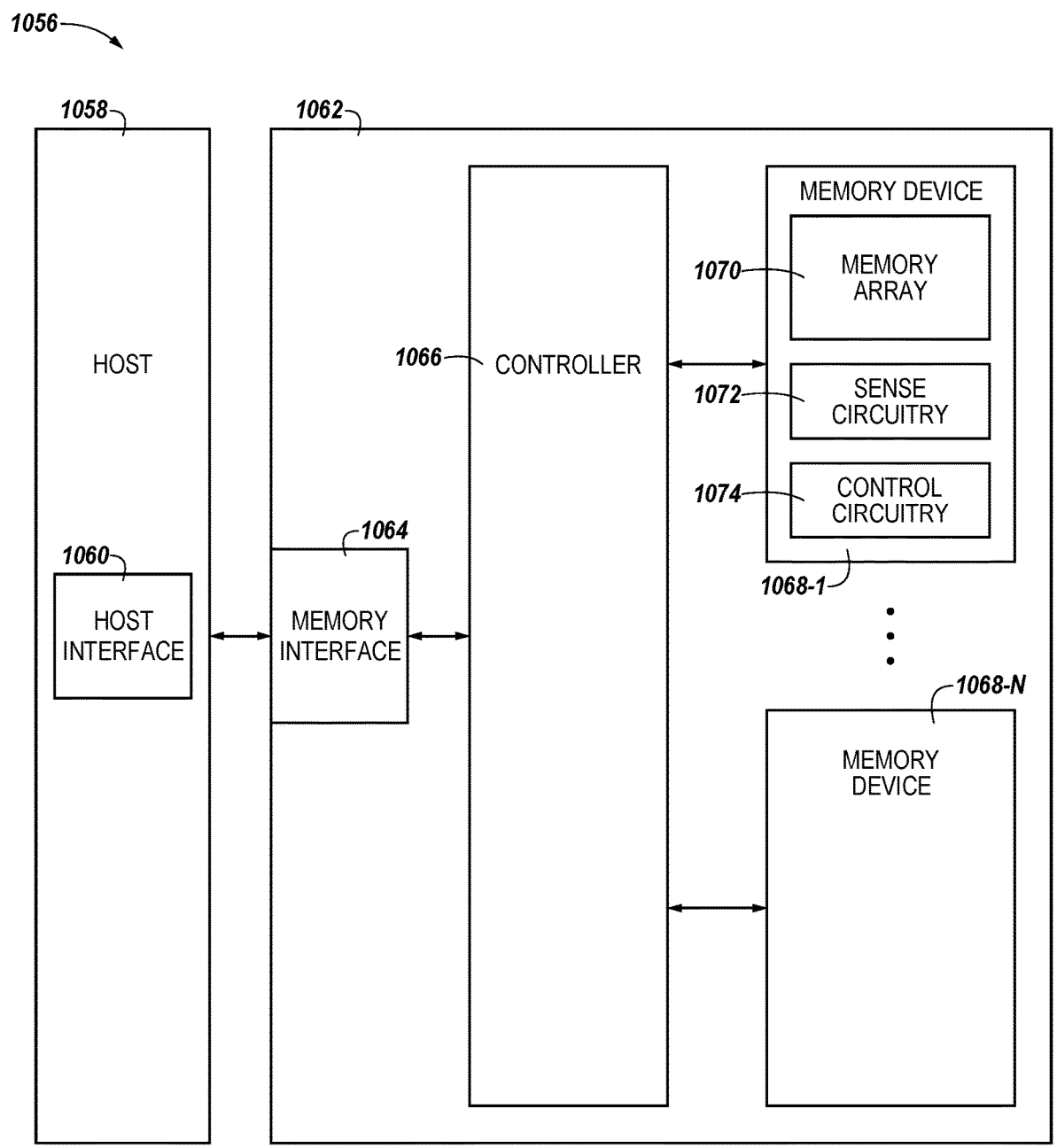
FIG. 10 is a functional block diagram of a computing system including at least one memory array having memory cells formed in accordance with a number of embodiments of the present disclosure.

FIG. 10 is a functional block diagram of a computing system 1056 including at least one memory system 1062 in accordance with one or more embodiments of the present disclosure. The numbering convention used in connection with FIG. 10 does not follow the earlier introduced numbering convention and sequence that applies to FIGS. 1-8. Memory system 1062 may be, for example, a solid-state drive (SSD).

In the embodiment illustrated in FIG. 10, memory system 1062 includes a memory interface 1064, a number of memory devices 1068-1, . . . , 1068-N, and a controller 1066 selectably coupled to the memory interface 1064 and memory devices 1068-1, . . . , 1068-N. Memory interface 1064 may be used to communicate information between memory system 1062 and another device, such as a host 1058. Host 1058 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host 1058 may be associated with fabrication operations performed on semiconductor devices and/or SSDs using, for example, a processing apparatus shown at 951 and described in connection with FIG. 9.

In a number of embodiments, host 1058 may be associated with (e.g., include or be coupled to) a host interface 1060. The host interface 1060 may enable input of scaled preferences (e.g., in numerically and/or structurally defined gradients) to define, for example, critical dimensions (CDs) of a final structure or intermediary structures of a memory device (e.g., as shown at 1068) and/or an array of memory cells (e.g., as shown at 1070) formed thereon to be implemented by the processing apparatus 951. The array includes access devices having epitaxially grown material formed according to embodiments described herein. The scaled preferences may be provided to the host interface 1060 via input of a number of preferences stored by the host 1058, input of preferences from another storage system (not shown), and/or input of preferences by a user (e.g., a human operator).

Memory interface 1064 may be in the form of a standardized physical interface. For example, when memory system 1062 is used for information (e.g., data) storage in computing system 1056, memory interface 1064 may be a serial advanced technology attachment (SATA) interface, a peripheral component interconnect express (PCIe) interface, or a universal serial bus (USB) interface, among other physical connectors and/or interfaces. In general, however, memory interface 1064 may provide an interface for passing control, address, information, scaled preferences, and/or other signals between the controller 1066 of memory system 1062 and a host 1058 (e.g., via host interface 1060).

Controller 1066 may include, for example, firmware and/or control circuitry (e.g., hardware). Controller 1066 may be operably coupled to and/or included on the same physical device (e.g., a die) as one or more of the memory devices 1068-1, . . . , 1068-N. For example, controller 1066 may be, or may include, an ASIC as hardware operably coupled to circuitry (e.g., a printed circuit board) including memory interface 1064 and memory devices 1068-1, . . . , 1068-N. Alternatively, controller 1066 may be included on a separate physical device that is communicatively coupled to the physical device (e.g., the die) that includes one or more of the memory devices 1068-1, . . . , 1068-N.

Controller 1066 may communicate with memory devices 1068-1, ..., 1068-N to direct operations to sense (e.g., read), program (e.g., write), and/or erase information, among other functions and/or operations for management of memory cells. Controller 1066 may have circuitry that may include a number of integrated circuits and/or discrete components. In a number of embodiments, the circuitry in controller 1066 may include control circuitry for controlling access across memory devices 1068-1, ..., 1068-N and/or circuitry for providing a translation layer between host 1058 and memory system 1062.

Memory devices 1068-1, ..., 1068-N may include, for example, a number of memory arrays 1070 (e.g., arrays of volatile and/or non-volatile memory cells). For instance, memory devices 1068-1, ..., 1068-N may include arrays of memory cells, such as a portion of an example memory device structured to include storage node contacts. At least one array includes an access device having a storage node contact formed according to the embodiments disclosed herein. As will be appreciated, the memory cells in the memory arrays 1070 of memory devices 1068-1, ..., 1068-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 1068 may be formed on the same die. A memory device (e.g., memory device 1068-1) may include one or more arrays 1070 of memory cells formed on the die. A memory device may include sense circuitry 1072 and control circuitry 1074 associated with one or more arrays 1070 formed on the die, or portions thereof. The sense circuitry 1072 may be utilized to determine (sense) a particular data value (e.g., 0 or 1) that is stored at a particular memory cell in a row of an array 1070. The control circuitry 1074 may be utilized to direct the sense circuitry 1072 to sense particular data values, in addition to directing storage, erasure, etc., of data values in response to a command from host 1058 and/or host interface 1060. The command may be sent directly to the control circuitry 1074 via the memory interface 1064 or to the control circuitry 1074 via the controller 1066.

The embodiment illustrated in FIG. 10 may include additional circuitry that is not illustrated so as not to obscure embodiments of the present disclosure. For example, memory device 1068 may include address circuitry to latch address signals provided over I/O connectors through I/O circuitry. Address signals may be received and decoded by a row decoder and a column decoder to access a memory array 1070. It will be appreciated that the number of address input connectors may depend on the density and/or architecture of memory devices 1068 and/or memory arrays 1070.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, oxide materials, nitride materials, buffer materials, etch chemistries, etch processes, solvents, memory devices, memory cells, openings, among other materials and/or components related to patterning a material over an active area for a storage node contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, oxide materials, nitride materials, buffer materials, etch chemistries, etch processes, solvents, memory devices, memory cells, sidewalls of openings and/or trenches related to patterning a material over an active area for a storage node contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for semiconductor structure formation, comprising:
   patterning a working surface of a semiconductor wafer;
   etching the patterned working surface of the semiconductor wafer to form trenches;
   performing a first high pressure, high temperature vapor etch as a pre-epitaxial growth clean to reduce toppling;
   epitaxially growing silicon (Si) on a plurality of pillars, wherein the plurality of pillars serve as active areas for an access device formed in the semiconductor wafer;
   performing a first deposition of a dielectric material in the trenches;
   performing a second high pressure, high temperature vapor etch to recess the dielectric material in the trenches; and
   performing a second deposition of the dielectric material to continue filling the trenches.

2. The method of claim 1, further comprising performing the first and second high pressure, high temperature vapor etches at a pressure of greater than 0.2 Torr (T) and a temperature greater than forty (40) degrees Celsius (° C.).

3. The method of claim 1, further comprising:
   performing a third high pressure, high temperature vapor etch to recess the dielectric material in the trenches; and
   performing a third deposition of the dielectric material to continue filling the trenches.

4. The method of claim 1, further comprising increasing a size of the active areas of the access device for a memory cell by epitaxially growing silicon on the plurality of pillars.

5. The method of claim 1, wherein etching the patterned working surface to form high aspect ratio trenches includes forming the trenches with an aspect ratio greater than 20.

6. The method of claim 1, further comprising using at least one of hydrogen fluoride (HF), nitrogen trifluoride ($NF_3$), and ammonia ($NH_3$) as reactants during the first high pressure, high temperature vapor etch and the second high pressure, high temperature vapor etch.

7. A method for semiconductor structure formation, comprising:
   patterning a working surface of a semiconductor wafer;
   etching the patterned working surface of the semiconductor wafer to form trenches;
   performing a first high pressure, high temperature vapor etch on a plurality of pillars as a pre-epitaxial growth clean at a pressure of greater than 0.2 Torr (T) and a temperature of greater than forty (40) degrees Celsius (° C.);
   epitaxially growing silicon (Si) on the cleaned surfaces of the plurality of pillars;
   performing a first deposition of a dielectric material to fill the trenches between the plurality of pillars;
   performing a second high pressure, high temperature vapor etch to recess the dielectric material in the trenches to a first depth; and
   performing a second deposition of the dielectric material to fill the trenches.

8. The method of claim 7, wherein performing the first and second depositions includes depositing the dielectric material to completely fill the trench.

9. The method of claim 7, further comprising:
   performing a third high pressure, high temperature vapor etch to recess the dielectric material in the trenches to a second depth; and
   performing a third deposition of the dielectric material to fill the trenches.

10. The method of claim 9, further comprising performing the second and the third high pressure, high temperature vapor etches to recess the dielectric material, wherein the height of the dielectric after the third high pressure, high temperature vapor etch is greater than the height of the dielectric material after the second high pressure, high temperature vapor etch.

11. The method of claim 7, further comprising sublimating reactant byproducts from the first and second high pressure, high temperature vapor etches in-situ to reduce toppling.

12. The method of claim 7, further comprising forming the trenches to have a width of less than fifteen (15) nanometers (nm) and an aspect ratio of greater than twenty (20).

* * * * *